US 6,717,214 B2

(12) United States Patent
Pettruzello et al.

(10) Patent No.: US 6,717,214 B2
(45) Date of Patent: Apr. 6, 2004

(54) SOI-LDMOS DEVICE WITH INTEGRAL VOLTAGE SENSE ELECTRODES

(75) Inventors: John Pettruzello, Carmel, NY (US); Benoit Dufort, Valhalla, NY (US); Theodore Letavic, Putnam Valley, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 70 days.

(21) Appl. No.: 10/152,235

(22) Filed: May 21, 2002

(65) Prior Publication Data

US 2003/0218211 A1 Nov. 27, 2003

(51) Int. Cl.[7] .................... H01L 27/01; H01L 27/12; H01L 31/0392
(52) U.S. Cl. ...................... 257/347; 257/507
(58) Field of Search .................. 257/347, 507

(56) References Cited

U.S. PATENT DOCUMENTS 6,627,958 B2 * 9/2003 Letavic et al. .............. 257/367

* cited by examiner

Primary Examiner—Thien F Tran
(74) Attorney, Agent, or Firm—Aaron Waxler

(57) ABSTRACT

The present invention provides a semiconductor device of the SOI-LDMOS type in which the field plate is divided into a plurality of electrically isolated sub-field plates. At least two of the divided sub-field plates are connected to external circuits for reading their respective output voltages. By connecting a first external circuit and a second external circuit having specific components, one is configured for determining an instantaneous output voltage and the other is configured for determining a change in output voltage as a function of time. Power is disconnected from the semiconductor device if either the instantaneous voltage or the derivative of voltage over time exceeds an established value.

7 Claims, 3 Drawing Sheets

SOI-LDMOS DEVICE WITH INTEGRAL VOLTAGE SENSE ELECTRODES

TECHNICAL FIELD

The present invention relates to the field of semiconductor devices of the type having a lateral drift region and a conducting field plate, and more particularly to provide such a semiconductor device integrally adapted for sensing and analysis of instantaneous and time-variable output voltage from source to drain.

BACKGROUND AND SUMMARY OF THE INVENTION

All electrical devices are capable of operating at a defined maximum voltage. Exceeding the rated maximum voltage results in an electrical breakdown, or possibly total destruction of the device. Semiconductor devices are similarly voltage sensitive. In previously known circuits in which a semiconductor device, e.g. a transistor, is subject to a high voltage, an external component was added to the circuit to detect the voltage. Connection of this external component to a controller allowed the voltage to be disconnected before the transistor was harmed. Of course, the addition of an external component involves added labor and expense.

The present invention recognizes that the semiconductor device itself can be configured to incorporate a separated field plate circuit for the determination of excess voltage, eliminating the need to add an external component for this purpose. The invention disclosed herein provides a modified SOI-LDMOS semiconductor device for enabling the detection of an output voltage between the source and drain of the device. The field plate of the device is isolated and divided into two or more sub-field plates, each of which has an external contact electrode. A first added circuit for detection and measurement of the instantaneous voltage is connected to a first of the electrodes and a second circuit for detection of the voltage over time is connected to a second of the electrodes.

Therefore, the invention disclosed below provides a semiconductor device comprising an isolated field plate that is split into a plurality of sub-field plates, each having a terminal connection area for sensing and analysis of voltage values therefrom, and an external analytical circuit.

DETAILED DESCRIPTION OF THE INVENTION

Figure 1:
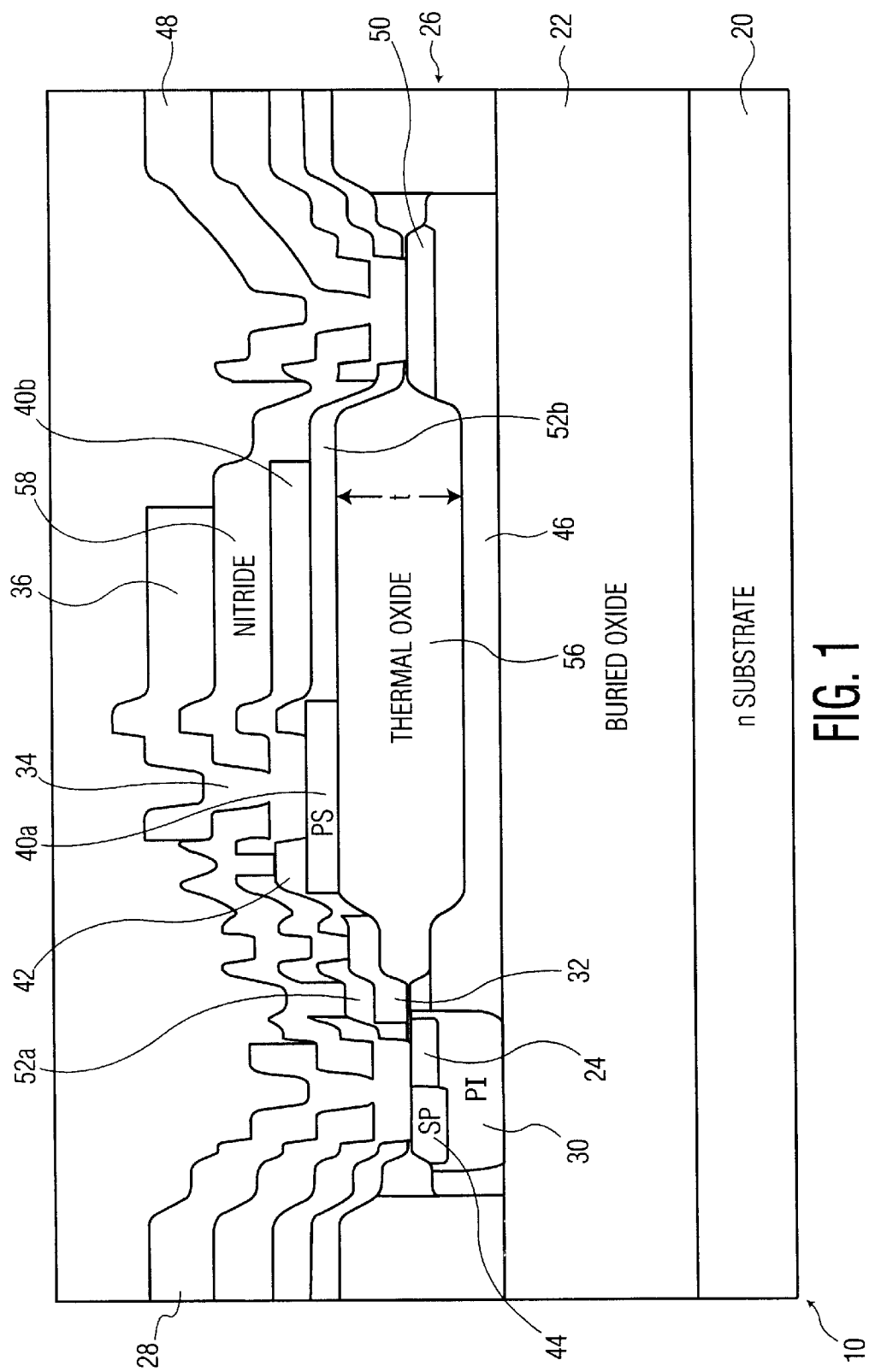
FIG. 1 is a first cross sectional view of a semiconductor device having an isolated field plate according to the present invention.

In the cross-sectional view of FIG. 1, a lateral thin film SOI MOS semiconductor device 10 includes a substrate 20, a buried insulating layer 22, and a semiconductor surface layer 26 in which the device is fabricated. The MOS transistor includes a source region 24 of one conductivity type, a body region 30 of a second, opposite conductivity type, a lateral drift region 46 of the first conductivity type and a drain region 50, also of the first conductivity type. The basic device structure is completed by a gate electrode 32, insulated from the semiconductor surface layer 26 by an oxide insulation region 56.

Gate electrode 32 is preferably formed of a polysilicon crystalline material. Within the scope of the invention, the MOS transistor structure used in the present invention will optionally have various performance enhancing features such as a stepped oxide region within field oxide region 56, an extended gate electrode structure formed as field portion 34, an insulating oxide layer 42 covering the gate electrode 32, a top field plate 40a, an extended top field plate portion 40b protruding laterally toward the drain side of the device, and a thinned lateral drift region portion 46, as well as numerous and various other performance enhancing features as may be desired, without departing from the spirit or scope of the invention. Sub-field plate 40a, being relatively close to source 28, is preferably formed of a polysilicon crystalline material, while sub-field plate 40b, being relatively close to drain 48 is preferably formed of a metal or other highly conductive material. As well, the MOS transistor 10 may also include a surface contact region 44, in contact with the source region 24, located in the body region 30 and being of the same conductivity type as the body region, but more highly doped. It is noted that for use in high voltage applications, where the drain to source voltage is on the order of hundreds of volts, the conducting top field plate is necessary in order to hold the voltage with maximum allowable drift region charge.

It is understood that the simplified representative device shown herein depicts particular device structures, but that wide variations in both device geometry and configuration can be used within the scope of the invention. Conventional semiconductor devices known in the art have a field plate which connects back to the source. In the invention described, the field plate is maintained as an isolated terminal with external connection electrodes.

Figure 2:
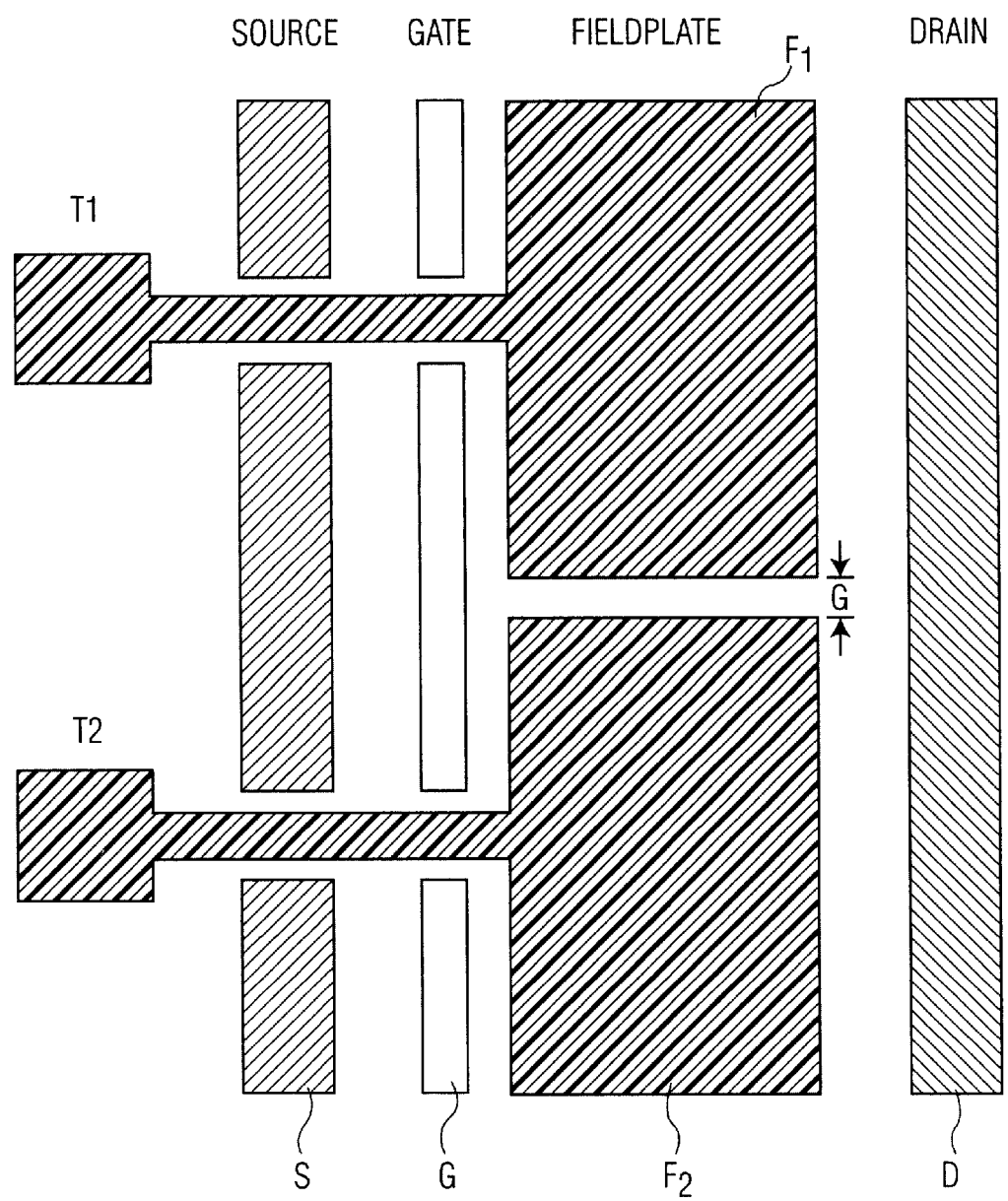
FIG. 2 is a second cross sectional view that is orthogonal to the first cross sectional view for showing in schematic form the semiconductor device of the invention in which the field plate is divided into two sub-field plates, each having a contact terminal for sensing voltage.

Referring now to FIG. 2, a diagrammatic cross sectional view of the SOI-LDMOS device of the invention, oriented perpendicular to the cross section of FIG. 1, is shown having an isolated field plate F (identified in FIG. 1 as part 40). The semiconductor device components are identified by letters in FIG. 2 to indicate their genericness. Field plate F is divided into two sub-field plates F1 and F2 of substantially equivalent size separated from each other by a gap G. Gap G is formed as equal to or less than the thickness t of field oxide region 56 (see FIG. 1) so as to prevent excessive breakdown deterioration in the device. As mentioned above, neither sub-field plate F1 nor sub-field plate F2 is connected to source region 28. Sub-field plates F1 and F2 are separate terminals in the invention described. Sub-field plate F1 is connected to external contact electrode T1. Sub-field plate F2 is connected to external contact electrode T2. Each of external contact electrodes T1 and T2 is positioned for connection to an external circuit, such as is manifested in, for example, a printed circuit board, as will be described below. According to the described configuration, the voltage potential at a selected time and measured at electrode T1 is substantially equal to the voltage potential at the same time at electrode T2. Additional components, designated in FIG. 2 as drain region D, gate region G and source region S, are substantially as described above in relation to FIG. 1. The apparent division of source region S and gate region G into sub-regions is merely to indicate that the connective terminals T1 and T2, extending outwardly from sub-field plates F1 and F2, respectively, are isolated therefrom. It will be further understood that the division of field plate F into two equal sub-field plates F1 and F2 is exemplary, and that another number of divided sub-field plates, e.g. 3, 4, 5, etc. is considered to be within the spirit and scope of the invention. It is further recognized that each of the plurality of equal sub-field plates will present an substantially equivalent external voltage result.

Figure 3:
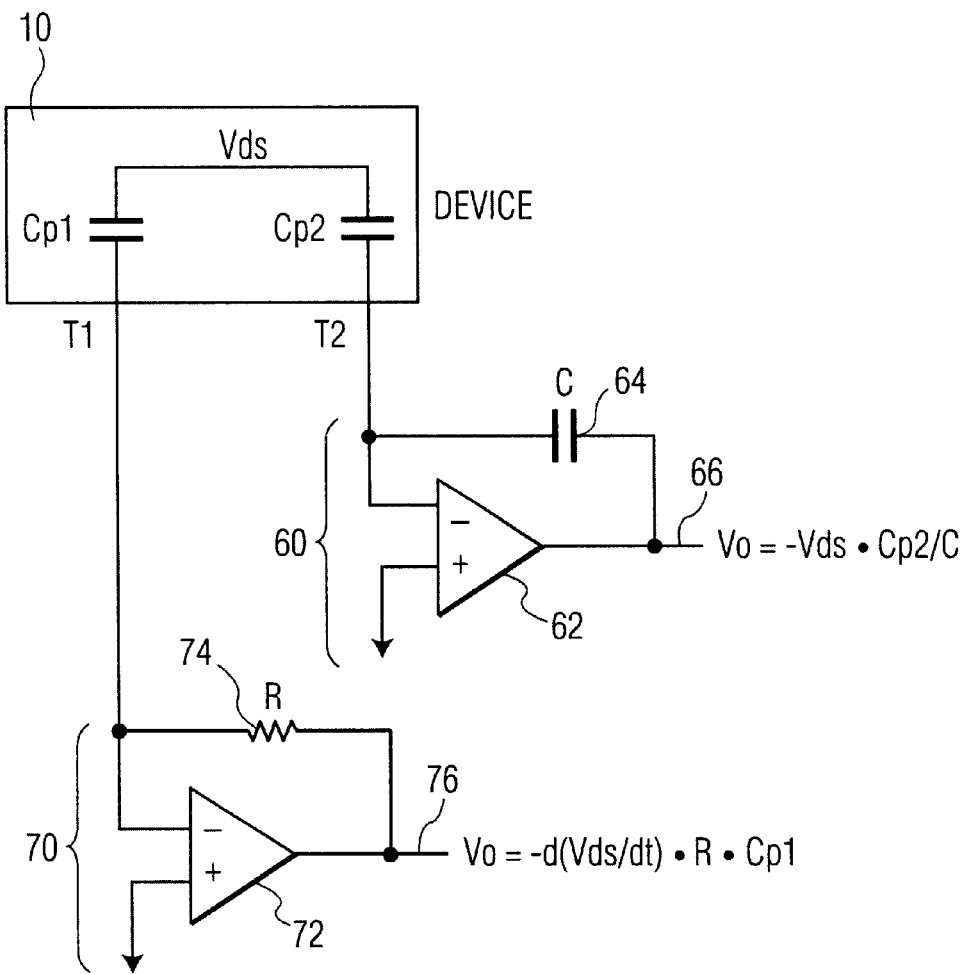
FIG. 3 is a diagram of a pair of exemplary circuits connected to the semiconductor device of the invention in which circuit (a) determines an instantaneous voltage drop from source to drain and circuit (b) determines a change in voltage drop from source to drain as a function of time.

Referring now to FIG. 3, a pair of sensing and analytical circuits (a) and (b) are illustrated as being connected to semiconductor device 10 in diagrammatic form. As will be understood by those skilled in the art, semiconductor devices inevitably create capacitance by their nature. Semiconductor device 10 is shown with a first and second parasitic capacitance $C_p1$ and $C_p2$ representing the capacitance between field plate region F and drain region D (see FIG. 2). According to circuit (a) 60 of FIG. 3, external contact electrode T2 is connected schematically between capatance $C_p2$ and the negative terminal of operational amplifier (op-amp) 62. The positive terminal of op-amp 62 is connected to ground. A further capacitor C 64 bridges the op-amp 62 negative terminal and output tap 66 in parallel relation with op-amp 62. As shown, the output voltage that appears at output tap 66 is represented by the formula:

$$V_O = -V_{ds} \times C_p2/C.$$

As seen, the above calculation will result in a reading of voltage drop between source and drain ($V_{ds}$). The voltage will typically range between 0–20V.

Referring now to circuit (b) 70 of FIG. 3, external contact electrode T1 is connected schematically between capacitance $C_p1$ and is externally connected to the negative terminal of operational amplifier (op-amp) 72. The positive terminal of op-amp 72 is connected to ground. Connection of the positive terminal of each op-amp 62 and 72 to ground assures that terminals T1 and T2 stay close to ground potential. A resistor R 74 bridges the op-amp 72 negative terminal and output tap 76 in parallel relation with op-amp 72. As shown, the output voltage that appears at output tap 66 is represented by the formula:

$$V_O = -dV_{ds}/dt \times R \times C_p1.$$

As seen, this calculation will result in a reading of voltage between source and drain as varying over time as limited by the detection circuit. It will be understood that the circuits and associated formulae are provided as examples of the type of sensing and analytical process that is possible according to the present invention. Other circuits and formulae are available to those skilled in the art. It will be further understood that although a determination of both $V_{ds}$ and $dV_{ds}/dt$ is possible from a unitary field plate, that by dividing the field plate the analytical circuits, e.g. circuits (a) and (b) of FIG. 3, can be optimized through adjusting the resistance and capacitance values applied.

Having determined the magnitude of the instantaneous voltage and the rate of change of the voltage from semiconductor device 10, the controller by which the formulae described above are computed compares the voltage values to established parameters. If it is determined that either the absolute voltage value is beyond a set maximum or that the voltage derivative is excessive, the power is disconnected, thus protecting the semiconductor device from overload.

While the present invention is described with respect to specific embodiments thereof, it is recognized that various modifications and variations may be made without departing from the scope and spirit of the invention, which is more clearly and precisely defined by reference to the claims appended hereto.

What is claimed is:

1. A semiconductor device of the type having a source region of a first conductivity type, a drain region, a substrate of a second conductivity type and a gate, the semiconductor device comprising a plurality of sub-field plates isolated from other terminals thereof, each sub-field plate having an electrode for sensing and analysis of voltage values therefrom.

2. The semiconductor device of claim 1, wherein the sub-field plates are substantially equal to one another in size.

3. The semiconductor device of claim 1, further comprising a first analytical circuit connected to a first of said plurality of electrodes and a second analytical circuit connected to a second of said plurality of electrodes.

4. The semiconductor device of claim 3, wherein the first analytical circuit is configured for sensing a voltage differential from source to drain.

5. The semiconductor device of claim 4, wherein the first analytical circuit comprises an operative amplifier connected in parallel with a capactior between the electrode and an output tap.

6. The semiconductor device of claim 3, wherein the second analytical circuit is configured for sensing a change in voltage differential from source to drain as a function of time.

7. The semiconductor device of claim 6, wherein the second analytical circuit comprises an operative amplifier connected in parallel with a resistor and between the electrode and an output tap.

* * * * *